United States Patent [19]

Akazawa et al.

[11] 4,413,187

[45] Nov. 1, 1983

[54] METHOD FOR EXPOSING AN ELECTRON BEAM

[75] Inventors: Yuji Akazawa, Kawasaki; Toshihiko Osada, Ebina; Takaharu Shima, Sagamihara; Yuji Tanaka; Masayuki Hattori, both of Kawasaki, all of Japan

[73] Assignee: Fujitsu Limited, Kawasaki, Japan

[21] Appl. No.: 295,584

[22] Filed: Aug. 24, 1981

[30] Foreign Application Priority Data

Aug. 26, 1980 [JP] Japan .................................. 55-117412

[51] Int. Cl.³ .............................................. H01J 37/00
[52] U.S. Cl. ................... 250/491.1; 250/492.2; 219/121 ER
[58] Field of Search .................. 250/398, 492.2, 491.1; 219/121 ER, 121 EU

[56] References Cited

U.S. PATENT DOCUMENTS

| | | | |
|---|---|---|---|
| 3,894,271 | 7/1975 | Pfeiffer et al. | 250/492.2 |
| 4,182,958 | 1/1980 | Goto et al. | 250/492.2 |
| 4,243,866 | 1/1981 | Pfeiffer et al. | 250/492.2 |

*Primary Examiner*—Bruce C. Anderson
*Attorney, Agent, or Firm*—Staas & Halsey

[57] ABSTRACT

Disclosed is a method for exposing an electron beam of a beam-shaping type, wherein the electron beam can be shaped into polygon having desired size by passing through a first and a second apertures. The position of the first or the second aperture tends to be deviated from its design position due to heat, resulting in a deviation of the electron beam. According to the invention, the offset value of the real image formed on the second aperture, with respect to the ideal image, is automatically determined by detecting a current passing through the second aperture. During an electron-beam exposure for patterning, the amount of deflection of the electron beam is corrected by taking the previously obtained offset value into consideration.

6 Claims, 6 Drawing Figures

Fig. 1A
Fig. 1B
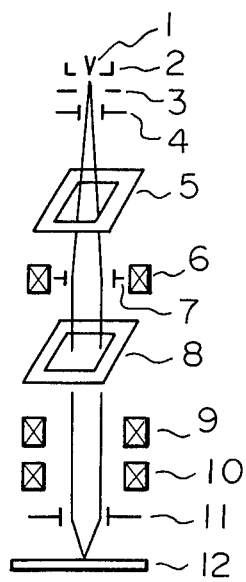
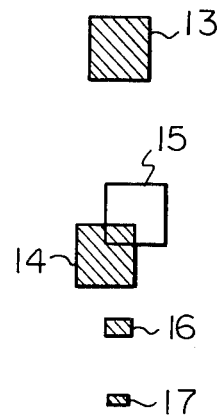

METHOD FOR EXPOSING AN ELECTRON BEAM

BACKGROUND OF THE INVENTION

The present invention relates to a method for exposing an electron beam, and more particularly to a method for automatically correcting the size of the beam which tends to be deviated from its design size due to a change in position of an aperture for shaping the beam.

In order to shorten the time for patterning by an electron beam exposure, an electron-beam exposure apparatus of a beam-shaping type has already been proposed (see, for example, VL-S2, which was designed by Fujitsu LTD, et al., described in Nikkei Electronics, no. 235, pp 44–48). The apparatus of this type comprises a first aperture for shaping the cross section of an electron beam into a polygon or a rectangle, a second aperture having a shape of a polygon or a rectangle arranged so as to be able to cut a part of the electron beam shaped by the first aperture, and a deflection unit for deflecting the beam shaped by the first aperture, to a desired position on the second aperture. The electron-beam apparatus of this type can generate a rectangle of variable size on the surface of a sample or a semiconductor wafer. The size is varied according to the deflection by the deflection unit. This prior art apparatus realizes not only the maximum patterning speed of about 5000 patterns per square centimeter but also realizes a minimum size length of less than 1 micron.

However, there is a problem in the above mentioned prior art. That is, although the positions of the first and the second apertures are strictly adjusted to desired positions, they may be deviated from the originally set positions during the passage of time due to, for example, heat produced in the inside of the apparatus by the exposed electron beam. Accordingly, to ensure that the beam size is varied to a size as designed on the surface of the wafer, it is necessary to periodically correct the position of the beam image of the first aperture with respect to the position of the second aperture.

SUMMARY OF THE INVENTION

It is a primary object of the present invention to provide a method for exposing an electron beam having a polygon shape with variable size, in which the position of the beam is periodically corrected with respect to the position of the first or the second aperture.

It is another object of the invention to provide such a method, in which the deviation of the position of the polygon-shaped beam image of the first aperture on the plane of the second aperture is automatically detected before executing the patterning.

It is still another object of the present invention to provide such a method, in which the position of the electron beam is periodically corrected by taking the previously detected deviation into consideration.

In order to achieve the above objects, the present invention provides a method for exposing an electron beam on the surface of a sample to draw a desired pattern on the surface by using an electron-beam exposure apparatus, the apparatus comprising a first diaphragm having a first aperture for shaping the cross section of the electron beam into a polygon, a second diaphragm having a second aperture arranged so as to partially stop the shaped electron beam, and a deflection unit for deflecting the electron beam having passed through the first aperture so as to position the electron beam on a desired position on the second diaphragm, the method comprising the steps of:

positioning an electron beam image of the first aperture;

moving the electron beam image, by the operation of the deflection unit, so that at least a part of the electron beam image crosses the second aperture;

detecting the above-mentioned part of the electron beam image passed through the second aperture;

determining the critical amount of deflection at which the above-mentioned part of the electron beam image begins to pass through the second aperture;

determining an offset value of a real image of the electron beam against the ideal image; and correcting the amount of deflection of the electron beam having passed through the first aperture according to the offset value.

BRIEF DESCRIPTION OF DRAWINGS

The foregoing objects and the characteristic features of the present invention are readily understandable through the following description when read in conjunction with the accompanying drawings, wherein:

FIG. 1A is a schematic view illustrating an electron beam and the apparatus for electron beam exposure;

FIG. 1B is a cross-sectional view illustrating cross sections of corresponding portions of the electron beam;

DETAILED DESCRIPTION OF THE PREFERRED EMBODIMENTS

Figure 2:
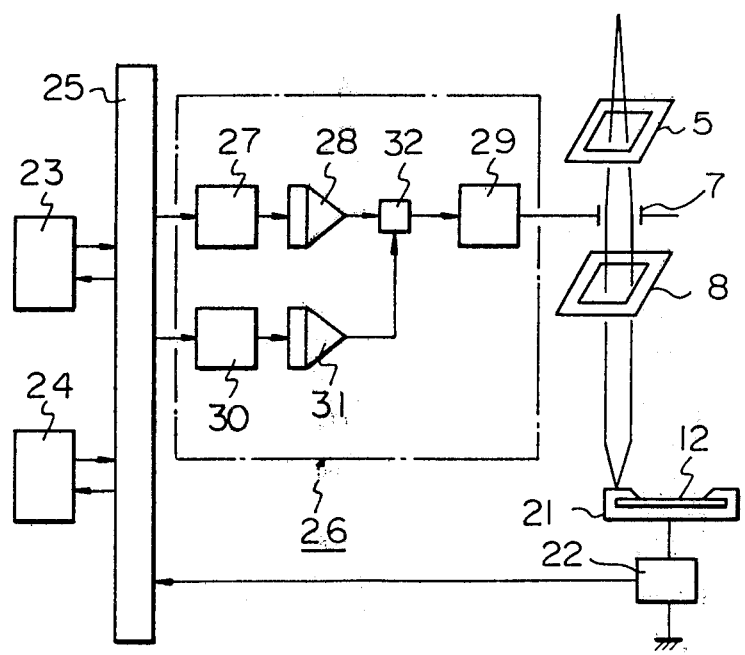
FIG. 2 is a schematic circuit diagram illustrating a main portion of an electron-beam exposure apparatus used in the method according to an embodiment of the present invention.

FIG. 1A is a schematic view illustrating an electron beam and the apparatus for electron beam exposure. Referring to FIGS. 1A, 1, 2, and 3 are a cathode, grid, and anode, respectively, constituting an electron gun; 4 is a deflection unit (deflector) for blanking an electron beam during unnecessary periods; 5 is a first diaphragm having a first aperture of a polygon (in the figure, a rectangular shape is illustrated); 6 is an electron lens; 7 is a deflection unit (deflector) for controlling the positions of the images, formed by the electron lens 6 on a second diaphragm 8 having a second aperture in the shape of a polygon (in the figure, a rectangular shape is illustrated), of the beam which passed through the first diaphragm 5; 9 is a demagnifying lens; 10 is a focusing lens; 11 is a deflection unit (deflector) for positioning a shaped beam formed on a sample 12 of, for example, a semiconductor wafer, on which resist is coated.

FIG. 1B is a cross-sectional view illustrating cross sections of corresponding portions of the electron beam. Referring to FIGS. 1A and 1B, an electron beam passing through the rectangular aperture of the first diaphragm 5 and shaped into a rectangular pattern is formed on the second diaphragm 8 by the electron lens 6 as a rectangular image 14 of the first aperture. The rectangular image 14 is controlled by the deflector 7 for positioning the formed image, and a part of the rectangular image passes through the rectangular aperture 15 of the second diaphragm 8 so that an electron beam of a rectangular shape 16 having a cross section with a predetermined size is obtained. The size and position of the electron beam are further controlled by the demagnifying lens 9, the focusing lens 10, and the positioning deflector 11, and are radiated as an electron beam having a desired pattern 17 on a predetermined position of the sample 12.

In the above-mentioned process, in order to strictly control the size of the pattern 17 projected on the surface of the sample 12, the position of the rectangularly shaped image 14 of the first aperture 13 formed on the second diaphragm 8 has to be controlled with a high accuracy with respect to the rectangular aperture 15 of the second diaphragm 8. To this end, the positions of the first diaphragm 5 and the second diaphragm 8 have been given a strict pre-adjustment. However, the positions of the above-mentioned first and second diaphragms are changed with the passage of time due to heat produced in the inside of the apparatus by the exposed electron beam, resulting in the accuracy of the pattern 17 or the patterning accuracy being lowered. In order to increase the patterning accuracy, the present invention provides a method for exposing electron beams in which the deviation of the position of the polygon-shaped image of the first aperture with respect to the polygon-shaped aperture of the second diaphragm is automatically detected to determine the amount to be corrected (the offset value) for correcting said deviation during patterning.

The present invention will be explained in detail with reference to an embodiment as follows.

FIG. 2 is a schematic circuit diagram illustrating a main portion of an electron-beam exposure unit used in an embodiment of the present invention, in which the same portions as in FIG. 1 are designated by the same references. In the figure, 5 is a first diaphragm; 7 is a deflection unit; 8 is a second diaphragm; 12 is a sample; 21 is a sample holder; 22 is an amperemeter for detecting sample currents flowing through the sample 12 or the sample holder 21; 23 is a central processing unit (CPU) of a computer; 24 is a memory storage unit of the computer; 25 is an interface unit; and 26 is a control portion of an exposing unit. The control portion 26 comprises a deflection control circuit 27 for electron beams having passed through the first diaphragm 5, a digital to analogue converter (DAC) 28 for converting the digital output from the deflection control circuit 27 to analog signals; and an amplifier 29 for amplifying the analogue output from the DAC28 and for providing the amplified analog signal to the deflection unit 7. According to the present embodiment, the control portion 26 further comprises a register 30 for storing the value of an offset, a DAC31 for converting the output of the register 30 to an analogue value, and an adder 32 for adding the output of the DAC31 to the output of the DAC28.

The method for detecting and correcting the deviation of the position of the projected image of the first aperture of the first diaphragm will now be explained with reference to FIG. 2 and in conjunction with FIGS. 3 and 4.

Figure 3A:
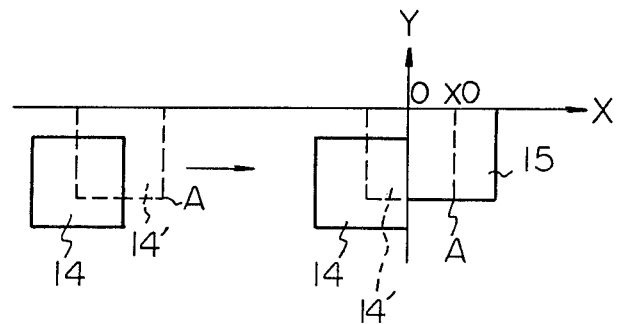
FIGS. 3A and 3B are schematic diagrams for explaining the steps of detecting an offset value with respect to the X direction and the Y direction, respectively.

In FIGS. 3A and B, 14 is a real image of the electron beam having passed through the first aperture of the first diaphragm 5 and formed on the second diaphragm 8. In this embodiment, the real image 14 has the shape of a rectangle. The notation 14' is an ideal image of the first aperture. The image 14' also has the shape of a rectangle. The central processing unit 23 designates the position of the ideal image 14' associated with the deflection unit 7, and 15 is a rectangular aperture of the second diaphragm 8. As illustrated in FIG. 3A, the upper left corner of the rectangular aperture 15 is taken as the origin of the coordinate system. The upper side and the left side of the rectangular aperture 15 are taken as the X axis and the Y axis, respectively.

Initially, the position of the ideal image 14' is designated by the CPU 23 so that the upper side of the ideal image 14' coincides with the X axis. The right hand side of the ideal image 14' is, at first, positioned sufficiently apart from the rectangular aperture 15 of the second diaphragm 8 so that the real image 14 does not overlap with the rectangular aperture 15. This positioning is effected by designating, for example, the initial X coordinate of the lower right corner A to be sufficiently apart from the origin. Preferably, the distance between the initial X coordinate of the lower right corner A and the origin is taken as a maximum correctable value, i.e., the maximum offset value.

In this situation, because the real image 14 is not projected on the rectangular aperture 15 of the second diaphragm 8, the current of the electron beam does not flow through the sample 12 or the sample holder 21 so that the output of the amperemeter 22 indicates zero.

Then, the CPU 23 controls the X coordinate of the lower right corner A via the deflection unit 7 so that the position of the corner A is moved in the direction illustrated by the arrow in FIG. 3 in a step by step fashion by a predetermined pitch $\Delta x$. When the corner of the real image 14 corresponding to the corner A of the ideal image has passed over the Y axis, a part of the electron beam can pass through the rectangular aperture 15 so that a current is detected by the amperemeter 22. The amperemeter 22 then provides a signal to the CPU 23 through the interface 25. When the signal is received by the CPU 23, it controls the X coordinate of the lower right corner A via the deflection unit 7 so that the position of the point A is moved in the opposite direction with respect to the previous movement in a step by step fashion by a pitch $\Delta x'$ which is smaller than the above-mentioned pitch $\Delta x$. The current flowing through the sample 12 or the sample holder 21 will be gradually decreased along with the movement of the ideal image 14' and of the real image 14 from the right to the left. When the right hand side of the real image 14 coincides with the Y axis, the electron beam is completely interrupted by the second diaphragm 8 so that the amperemeter 22 indicates zero. At this time, the X coordinate of the lower right corner A of the ideal image 14' is determined as $X_O$ by the CPU 23. The coordinate $X_O$ is stored in the memory storage unit 24.

Figure 3B:
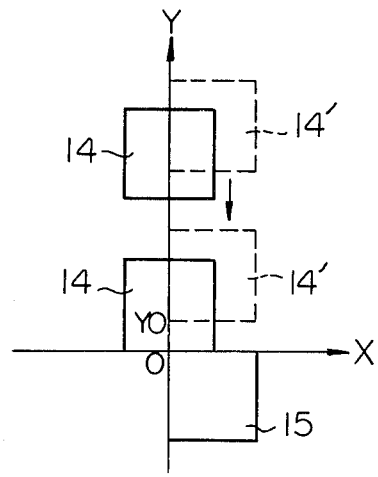

In a similar way as explained above with respect to the X axis, the Y coordinate of the lower right corner A of the ideal image 14' is determined as $Y_O$ when the lower side of the real image 14 coincides with the X axis as illustrated in FIG. 3B. The coordinate $Y_O$ is also stored in the memory storage unit 24.

In practice, in order to determine an offset value, it is necessary to take an expansion error and a rotation error into consideration. As is well known, the differences $\Delta x$ and $\Delta y$ between the ideal image 14' and the real image 14 with respect to the X-axis direction and the Y-axis direction, respectively, are expressed as:

$$\Delta x = AX + BY$$

$$\Delta y = DX + CY,$$

where the coordinates of the lower right corner A of the ideal image 14' are expressed by X and Y. A, B, C, and D are digital constants which have been predetermined experimentally by taking into account the expansion error due to the errors in the electron lens 6, the demagnifying lens 9, or the focusing lens 10, and the rotation error due to the errors in the positioning of the first or the second diaphragm. The expansion error and the positioning error can be considered to be constant unless the property of these lenses changes during the electron-beam exposure. The digital constants A and C relate to the expansion errors in the X direction and the Y direction, respectively. B and D relate to the rotation errors in the X direction and the Y direction.

Now, in the above expressions, let us assume that X and Y are equal to the above-mentioned $X_O$ and $Y_O$, respectively. Then, we obtain:

$$\Delta x_O = AX_O + BY_O$$

$$\Delta Y_O = DX_O + CY_O$$

The values $\Delta x_O$ and $\Delta y_O$ are components in the X direction and in the Y direction, respectively, of an offset value OF for correcting the position of the real image 14 so that the real image 14 is precisely formed on the ideal image 14'. The CPU 23 calculates the values $AX_O$ and $DX_O$ and stores them in the memory storage unit 24, after the value $X_O$ is determined. Then, the values $BY_O$ and $CY_O$ are also calculated and stored in the memory storage unit 24 after the value $Y_O$ is determined. The components $\Delta x_O$ and $\Delta y_O$ of the offset value are then calculated by the CPU 23.

Figure 4:
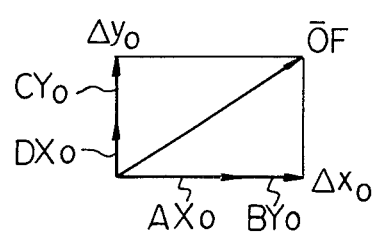
FIG. 4 is a schematic diagram for explaining the offset value.

FIG. 4 is a schematic diagram for explaining the offset value. As illustrated in FIG. 4, the offset value OF is represented by the inner product of the vector $\Delta x_O$ and the vector $\Delta Y_O$. The component $\Delta x_O$ is obtained by adding the values $AX_O$ and $DY_O$. The component $\Delta y_O$ is obtained by adding the values $DX_O$ and $CY_O$.

The components $\Delta x_O$ and $\Delta y_O$ obtained as above are sent through the interface 25 to the register 30 and stored in it. It should be noted that, although only one control portion 26 is illustrated in FIG. 2, one is actually provided with respect to each of the X axis and the Y axis. Therefore, the components $\Delta x_O$ and $\Delta y_O$ are stored in the respective registers.

As the offset value is determined as mentioned above, patterning then follows. To this end, the sample 12 is moved to a predetermined position by moving a stage (not shown) on which a sample holder 21 is mounted. In order to make the shape of the cross section of an electron beam, which reaches to the surface of the sample 12, into a rectangle having a desired size according to the pattern to be drawn, data X and Y are provided by a command from the CPU 23, for designating the position of the ideal image 14', and the deflection control circuit 27 provides digital signals corresponding to X and Y to the DAC 28. Simultaneously, the above-mentioned register 30 provides, in accordance with commands from the CPU 23, digital signals corresponding to the components $\Delta x_O$ and $\Delta y_O$ of the offset value OF to the DAC 31. The $DAC_s$ 28 and 31 convert the received digital signals to corresponding analogue signals which are sent to the adder 32. In the adder 32, they are added. In the amplifier 29, they are amplified to be applied to the deflection unit 7.

Thus, because the electron beam having passed through the first diaphragm 5 is deflected taking the offset value OF into consideration, the electron beam is precisely projected onto the designated position on the second diaphragm 8. Therefore, since the shape of the cross section of an electron beam which reaches to the surface of the sample 12 is precisely controlled to have a desired size, the pattern can be drawn with high accuracy.

According to this embodiment, all of the above-mentioned operations for determining the offset value can be effected automatically within a short time. Accordingly, the above-mentioned operations can be effected on each sample, and the accuracy in the drawing is improved without lowering the efficiency of exposure.

As has been explained above, according to the present invention, in a method for electron beam exposure of a shaped beam type, errors in the shape of the cross section of a shaped beam, which change with the passage of time due to, for example, heat produced in the inside of the apparatus, can be automatically corrected, and therefore, a pattern can be drawn with high accuracy.

The present invention is not restricted to the above-mentioned embodiment, but many changes and modifications are possible without departing from the scope of the invention. For example, the shape of the first or the second aperture may be a polygon instead of a rectangle.

We claim:

1. A method for providing an electron beam with a desired shape on the surface of a sample to form a desired pattern on said surface by using an electron-beam exposure apparatus, said apparatus comprising a first diaphragm having a first aperture for shaping the cross section of the electron beam into a polygon, a second diaphragm having a second aperture arranged so as to selectively stop the shaped electron beam corresponding to the image of the first aperture, wherein the position of the real image of said first aperture changes from the initial position of the ideal image during the operation of said electron-beam exposure apparatus, and a deflection unit for deflecting the electron beam having passed through said first aperture so as to position the shaped electron beam on a desired area on the second diaphragm according to said desired shape, said method comprising the steps of:

positioning a selected one of said ideal and real images of said first aperture on said second diaphragm;

moving said positioned image, by the operation of said deflection unit, between a position where at least a part of said shaped electron beam passes through said second aperture and a position where no part of said shaped electron beam passes through said second aperture;

detecting the part of the shaped electron beam passing through said second aperture;

determining the critical amount of deflection at which the shaped electron beam begins to pass through said second aperture from the results of said moving and detecting;

determining an offset value between the real image of the first aperture from the ideal image thereof; and correcting the amount of deflection of the shaped electron beam having passed through said first aperture according to said offset value;

wherein the change in the position of the real image with respect to the ideal image, arising during operation of said exposure apparatus, may be corrected during said operation for providing said desired shape at the surface of the sample.

2. A method for providing an electron beam with a desired shape on the surface of a sample to form a desired pattern on said surface by using an electron-beam exposure apparatus, said apparatus comprising a first diaphragm having a first aperture for shaping the cross section of the electron beam into an initial rectangle, wherein the position of the real image of said first aperture changes from the position of the ideal image during the operation of said electron-beam exposure apparatus, a second diaphragm having a second aperture arranged so as to selectively stop the shaped electron beam, corresponding to the real image of the first aperture, and a deflection unit for deflecting the electron beam having passed through said first aperture so as to position the shaped electron beam at a desired area on the second diaphragm according to said desired shape, said method comprising the steps of:

positioning said ideal image of said first aperture on said second diaphragm so that a first side of said ideal image and the corresponding first side of said second aperture are both aligned along the X axis of a coordinate system in the plane of said second aperture;

moving said ideal image along said X axis by operating said deflecting unit, while detecting any current flowing through said sample due to any part of the shaped electron beam having passed through said second aperture, for determining a boundary point on said X axis between a first region and said X axis where said current is not flowing and a second region where said current is flowing;

positioning said ideal image on said second diaphragm so that a second side of said ideal image, perpendicular to said first side of said ideal image, and the corresponding second side of said second aperture are placed on the Y axis of said coordinate system, said second side of said second aperture being perpendicular to said first side thereof;

moving said ideal image along said Y axis by operating said deflection unit, while detecting a current flowing through said sample due to any part of the shaped electron beam having passed through said second aperture, for determining a boundary point on said Y axis between a first region along said Y axis where said current is not flowing and a second region where said current is flowing;

determining an offset value corresponding to the difference in position between the real image and the position of said ideal image, by taking said first and second boundary points into consideration; and correcting the amount of deflection of the electron beam having passed through said first aperture by said offset value;

wherein changes in the position of the real image with respect to the ideal image, arising during operation of said exposure apparatus, may be corrected during said operation for providing said desired shape at the surface of the sample.

3. A method as set forth in claim 2, wherein said step of determining said offset value comprises the step of determining components, in the X direction and in the Y direction of said coordinate system, of said offset value by using said boundary points and predetermined constants corresponding to expansion error and rotation error of the electron beam.

4. A method as set forth in claim 2 or 3, wherein each said step of moving said ideal image along said X axis and said Y axis comprises the step of moving said ideal image along the respective axis in a step by step fashion by a first predetermined pitch until said current is first detected, and then moving said design image in the opposite direction in a step by step fashion by a second predetermined pitch, which is smaller than said first predetermined pitch, until said current is not detected.

5. The method of claim 2, the sides of the openings of said first and second apertures being aligned along respective ones of said X and Y axes.

6. The method of claim 3, the sides of the openings of said first and second apertures being aligned along respective ones of said X and Y axes.

* * * * *

UNITED STATES PATENT AND TRADEMARK OFFICE
CERTIFICATE OF CORRECTION

PATENT NO. : 4,413,187

DATED : 1 November 1983

INVENTOR(S) : YUJI AKAZAWA et al

It is certified that error appears in the above-identified patent and that said Letters Patent is hereby corrected as shown below:

Front page, [57] ABSTRACT, line 4, delete "a" (both occurrences).

Column 3, lines 47, 50 and 55, "analogue" should be --analog--.

Column 5, line 67, "analogue" should be --analog--.

Signed and Sealed this

Twenty-eighth Day of February 1984

[SEAL]

Attest:

GERALD J. MOSSINGHOFF

Attesting Officer

Commissioner of Patents and Trademarks